United States Patent
Min et al.

(10) Patent No.: US 7,339,843 B2
(45) Date of Patent: Mar. 4, 2008

(54) METHODS AND CIRCUITS FOR PROGRAMMING ADDRESSES OF FAILED MEMORY CELLS IN A MEMORY DEVICE

(75) Inventors: Young-sun Min, Seoul (KR); Nam-jong Kim, Gyeonggi-do (KR); Jong-hyun Choi, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 29 days.

(21) Appl. No.: 11/229,918

(22) Filed: Sep. 19, 2005

(65) Prior Publication Data

US 2006/0062060 A1 Mar. 23, 2006

(30) Foreign Application Priority Data

Sep. 20, 2004 (KR) ...................... 10-2004-0075114

(51) Int. Cl.
*G11C 29/00* (2006.01)
(52) U.S. Cl. ..................... 365/200; 365/201; 365/225.7
(58) Field of Classification Search ................ 365/200, 365/201, 225.7
See application file for complete search history.

(56) References Cited

U.S. PATENT DOCUMENTS

| 6,829,176 | B2 * | 12/2004 | Callaway et al. | ........... 365/200 |
| 2002/0012282 | A1 * | 1/2002 | Saito et al. | ................. 365/200 |
| 2003/0213954 | A1 | 11/2003 | Fujima | ........................ 257/48 |
| 2004/0136248 | A1 * | 7/2004 | Kozuka | ...................... 365/201 |

FOREIGN PATENT DOCUMENTS

| JP | 2002042494 | 2/2002 |
| KR | 1020020058488 | 7/2002 |

* cited by examiner

*Primary Examiner*—Huan Hoang
(74) *Attorney, Agent, or Firm*—Myers Bigel Sibley & Sajovec, P.A.

(57) ABSTRACT

A method of programming addresses of failed memory locations in a memory device can be provided by generating a plurality of fail address signals corresponding to a plurality of addresses of failed memory locations in the memory device and then programming the plurality of addresses of failed memory locations to programming cells for use by a redundant circuit during read or write operations to the plurality of addresses of failed memory locations.

17 Claims, 5 Drawing Sheets

METHODS AND CIRCUITS FOR PROGRAMMING ADDRESSES OF FAILED MEMORY CELLS IN A MEMORY DEVICE

CROSS-REFERENCE TO RELATED APPLICATION

This application claims the priority of Korean Patent Application No. 10-2004-0075114, filed on Sep. 20, 2004, in the Korean Intellectual Property Office, the disclosure of which is incorporated herein in its entirety by reference.

FIELD OF THE INVENTION

The present invention relates to memory devices, and more particularly, to redundancy in memory devices.

BACKGROUND

It is known for memory devices to have defects which can prevent the device from operating as designed. In particular, defects can occur during the manufacture of memory devices so that memory cells within the array do not operate properly. For example a defect in a memory cell (or associated circuitry) can cause data written to the memory cell to be stored incorrectly or not at all. Furthermore, the defect may prevent the data from being reliably read from the addressed memory cell. Any of these types of defects can reduce the manufacturing yield for the flash memory device.

It is known to include redundant memory cells in the memory, which can selectively replace normal memory cells that are determined to be defective to improve the manufacturing yield of the memory. The addresses associated with the defective memory cells can be stored and compared to addresses associated with memory operations (i.e., read operations and write operations). If the address matches a stored address, a redundancy circuit can re-route (or map) the data to or from the memory so that the defective memory cells are not used for the memory operation. For example, during a write operation, write data (which would otherwise be directed to a known defective memory cell) can be re-routed to a redundant memory cell. Later, when a read operation is directed to the address of the known defective memory cell, the redundant memory cell, as well as the known defective memory cells, is accessed. The data retrieved from the redundant memory cell is re-routed to replace the data that was read from the known defective memory cell to provide the data that was previously written to the accessed address.

The operation of replacing the address corresponding to a failed memory cell with the address of spare cell is sometimes referred to as a fail address programming operation. FIG. 1 is a block diagram showing a conventional fail address programming circuit. The fail address programming circuit 100 is a circuit that stores fail address signals (FAS) generated through the test using internal fuses. The fail address signal stored in the fail address programming circuit 100 is compared to an input write address signal to be used in the elimination of failures from of the memory cell.

Referring to FIG. 1, the conventional fail address programming circuit 100 includes programming cells PCELL1~PCELLn that program the FAS. The fail address signal FAS is a signal having information about the position of fail cell that is found by the test. The fail address signal FAS is applied to all programming cells PCELL1~PCELLn.

In addition, the programming cell, to which an activated selection signal is applied, receives and stores the FAS. In addition, the FAS is programmed in response to a programming signal PS. Here, "programming" means that a fuse in the programming cell is connected or blocked by the programming signal PS. It can be assumed that a plurality of fail memory cells are found by the test.

The FAS corresponding to the position of the fail memory cell that is initially found is applied to the programming cells PCELL1~PCELLn. In addition, a first selection signal S1 is activated. Then, the first programming cell PCELL1 stores the FAS that is found first.

A programming signal PS is applied to the first programming cell PCELL1 through an input pin or a pad 10. Then the first programming cell PCELL1 programs the FAS that is found first.

Then, the FAS corresponding to a position of the fail memory cell that is found second is applied to the programming cells PCELL1~PCELLn. A second selection signal S2 is activated. Here, the first selection signal S1 is deactivated. Then, the second programming cell PCELL2 stores the fail address signal FAS that is found second.

A programming signal PS is applied to the second programming cell PCELL2 through the input pin or the pad 10. Then, the second programming cell PCELL2 programs the FAS that is found second.

FIG. 2 is a flow chart illustrating a conventional fail address programming method. Referring to FIG. 2, in the conventional fail address programming method 200, when a fail address signal is generated (210), the fail address signal is applied to corresponding programming cell in response to corresponding selection signal (220).

The fail address signal applied to the programming cell is programmed in response to the programming signal (230). If a plurality of fail address signals are generated, that is, a plurality of fail memory cells are found, 210~230 are repeated until the found fail address signal are all programmed.

SUMMARY

Embodiments according to the invention can provide methods and circuits for programming addresses of failed memory cells in a memory device. Pursuant to these embodiments, a method of programming addresses of failed memory locations in a memory device can be provided by generating a plurality of fail address signals corresponding to a plurality of addresses of failed memory locations in the memory device and then programming the plurality of addresses of failed memory locations to programming cells for use by a redundant circuit during read or write operations to the plurality of addresses of failed memory locations.

In some embodiments according to the invention, programming the plurality of addresses of failed memory locations further includes latching ones of the plurality of fail address signals sequentially during a test of the memory device to determine the failed memory locations in the memory device to provide a plurality of latched addresses of failed memory locations. The plurality of latched addresses of failed memory locations can be provided to the programming cell substantially simultaneously.

In some embodiments according to the invention, programming the plurality of addresses of failed memory locations includes programming the plurality of addresses of failed memory locations to programming cells substantially simultaneously. In some embodiments according to the invention, generating a plurality of fail address signals includes generating all fail address signals for the memory device during a test of the memory device before programming the plurality of addresses of failed memory locations to the programming cells.

In some embodiments according to the invention, generating a plurality of fail address signals includes generating the plurality of fail address signals in a test sequence for the memory device. Programming the plurality of addresses of failed memory locations to programming cells includes programming the plurality of addresses of failed memory locations to the programming cells in parallel.

In some embodiments according to the invention, a fail address programming circuit in a memory device can include a plurality of latches configured to store a plurality of fail address signals corresponding to a plurality of addresses of failed memory locations in the memory device and to provide the plurality of addresses of failed memory locations for programming after the plurality of fail address signals have been latched.

In some embodiments according to the invention, the plurality of fail address signals are determined sequentially during a test of the memory device to determine the failed memory locations in the memory device to provide a plurality of latched addresses of failed memory locations. In some embodiments according to the invention, the circuit further includes a plurality of programming cells coupled to the plurality of latches, wherein the plurality of programming cells are configured for programming with plurality of addresses of failed memory locations substantially simultaneously.

DESCRIPTION OF EMBODIMENTS ACCORDING TO THE INVENTION

Figure 1:
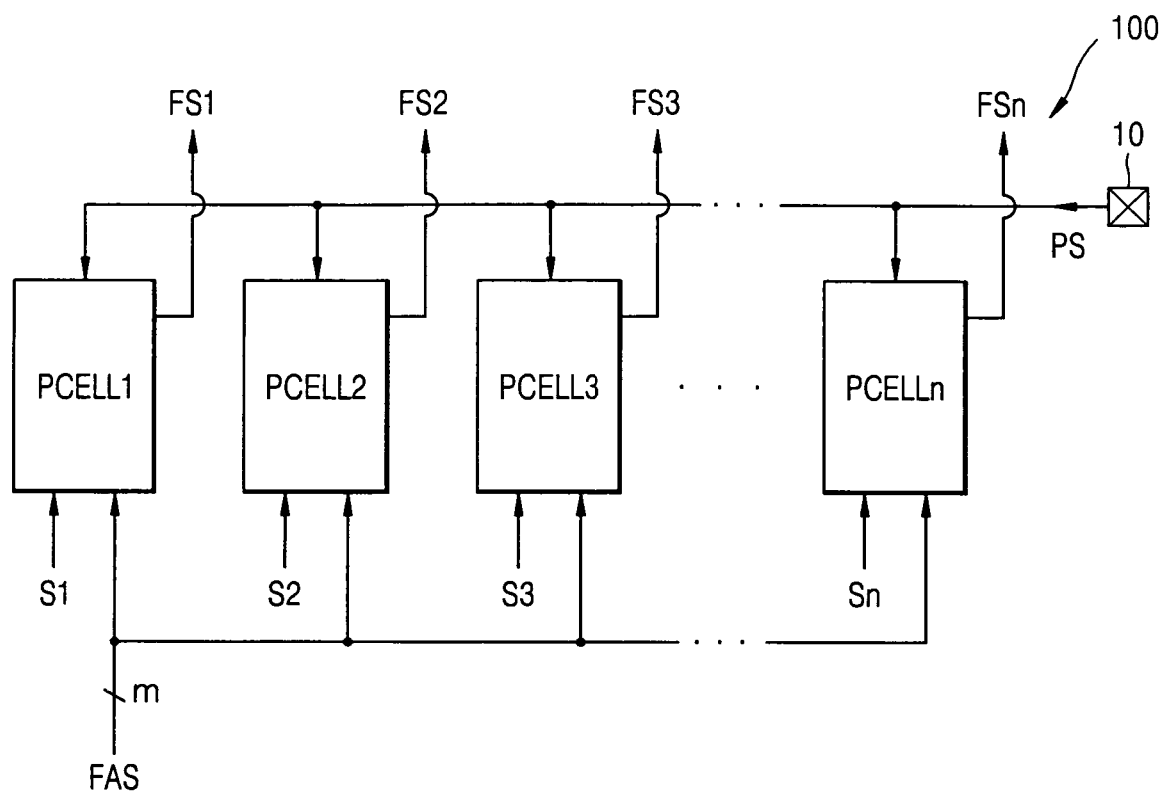
FIG. 1 is a block diagram showing a conventional fail address programming circuit.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe elements and should not be limited by these terms. These terms are only used to distinguish one element from another. Thus, a first element discussed below could be termed a second element, and a second element may be termed a first element without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Hereinafter, the present invention will be described in detail by explaining preferred embodiments of the invention with reference to the attached drawings.

As appreciated by the present inventors, according to the conventional fail address programming circuit 100 (in FIG. 1) or the fail address programming method 200, in order to program the FASs corresponding to n number of fail memory cells, the FASs should be input n times, and the programming signals PS should be input n times through the input pin or the pad 10, thus it may take a significant time to program the FASs corresponding to all of the fail memory cells.

Figure 3:
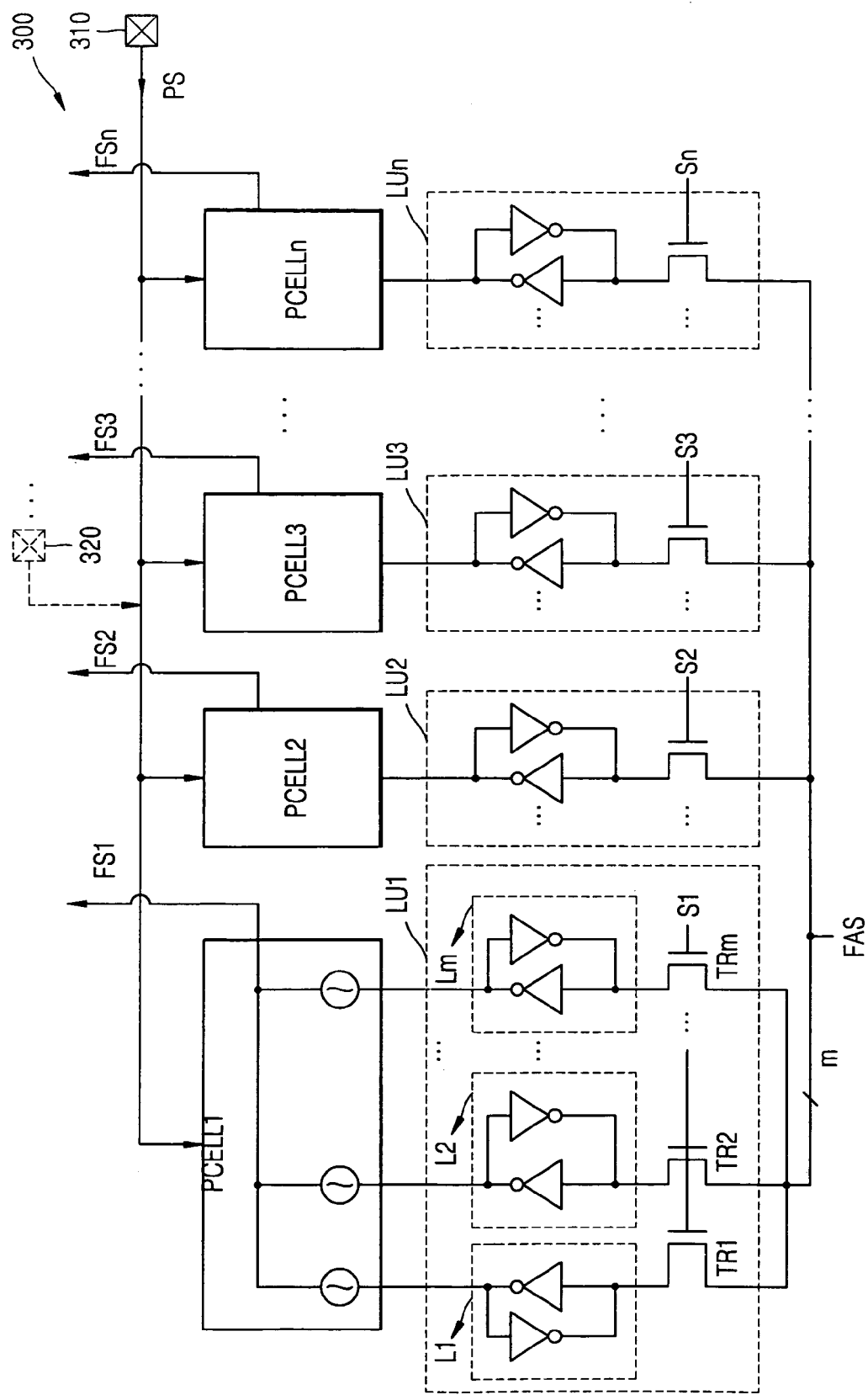
FIG. 3 is a block diagram showing a fail address programming circuit according to the present invention.

FIG. 3 is a block diagram showing a fail address programming circuit according to some embodiments of the present invention. Referring to FIG. 3, the fail address programming circuit 300 includes a first~nth latch units LU1~LUn and a first~nth programming cells PCELL1~PCELLn. The first through nth latch units LU1~LUn store fail address signals FASs of m bits having information about positions of fail cells in the semiconductor memory device in response to first~nth selection signals S1~Sn.

The first~nth programming cells PCELL1~PCELLn receive the FASs output from the first~nth latch units LU1~LUn, and perform programming operations corresponding to the FAS in response to the programming signals. The first~nth programming cells PCELL1~PCELLn perform the programming operations in response to the programming signal PS.

When a plurality of fail memory cells are found by a test, a plurality of FASs of m bits having information about the positions of the fail memory cells are generated. The process of generating the FASs can be easily understood by those who skilled in the art, thus descriptions for the process are omitted.

The FAS is m bits, and indicates a position of one failed memory cell according to the logical value of each bit, that is, "1" or "0". The FAS that is generated first is applied to the first~nth latch units LU1~LUn. The first latch unit LU1 among the first~nth latch units LU1~LUn stores the FAS that is generated first in response to the first selection signal S1. That is, the FAS is applied to all latch units LU1~LUn, however, the latch unit that receives the activated selection signal only receives the FAS.

The first~nth selection signals S1~Sn are sequentially activated in an order of the first selection signal S1~nth selection signal Sn. In some embodiments according to the invention, the first~nth selection signals S1~Sn can be controlled by a mode register set (MRS) signal so as to be activated sequentially.

Since the first~nth selection signals S1~Sn are sequentially activated, the FAS that is generated first is stored in the first latch unit LU1, the FAS that is generated second is stored in the second latch unit LU2, and the nth generated FAS is stored in the nth latch unit LUn.

The first~nth selection signals S1~Sn control transistors of the respective latch units LU1~LUn to input the FASs to the latch units LU1~LUn. The first~nth latch units LU1~LUn include m number of switches that transmit or block the corresponding FAS of m bits in response to corresponding selection signals S1~Sn, and m number of latches L1~Lm that receive and store the FASs from the m number of switches. The switches are transistors that are turned on or turned off in response to the selection signals S1~Sn.

Structures of first~nth latch units LU1~LUn are analogous to one another, thus the structure of the first latch unit LU1 is shown in FIG. 3 in detail, while the remaining latch units are not. Since the FAS has m bits, the switches transmitting or blocking the FASs in response to the first selection signal S1 are also m number of transistors (TR1, TR2~TRm). When the first selection signal S1 is activated at high level, the FASs are stored in m number of latches L1~Lm.

The m number of latches L1~Lm store logical values of the respective bits in the FASs. In a case where a plurality of FASs are generated, the FAS generated first is stored in the first latch unit LU1 and nth generated FAS is stored in the nth latch unit LUn.

The first~nth programming cells PCELL1~PCELLn include fuses that are connected or blocked in response to the FASs. The fuses may be anti-fuses or electrical fuses. The anti-fuse is initially cut, however connected when the signal is applied thereto, and the electrical fuse operates in response to an electrical signal.

The fuses included in the first~nth programming cells PCELL1~PCELLn can be other types besides the anti-fuse or the electrical fuse. The FASs stored in the first~nth latch units LU1~LUn are applied to the corresponding programming cells PCELL1~PCELLn, and programmed at once in response to the programming signals PS.

The programming signal PS is a current or a voltage input from the outside through at least one input/output pin or pad 310 or 320. There may be a plurality of input/output pins or pads that apply the programming signals PS. The fuses in the programming cells PCELL1~PCELLn are connected or blocked by the programming signal PS that is a current signal or a voltage signal according to the logical value of the input FAS.

The first~nth programming cells PCELL1~PCELLn output fuse signals FS1~FSn having logical values corresponding to the fail addresses stored in the inner fuses. The fuse signals FS1~FSn control redundant circuits (not shown) that perform the failure elimination process.

According to the fail address programming circuit 300 of the present invention shown in FIG. 3, the fail address signals FAS are input into all the programming cells PCELL1~PCELLn, and after that, these are programmed at once by the programming signal PS. Therefore, the programming time of the fail address signal FAS can be reduced.

Figure 4:
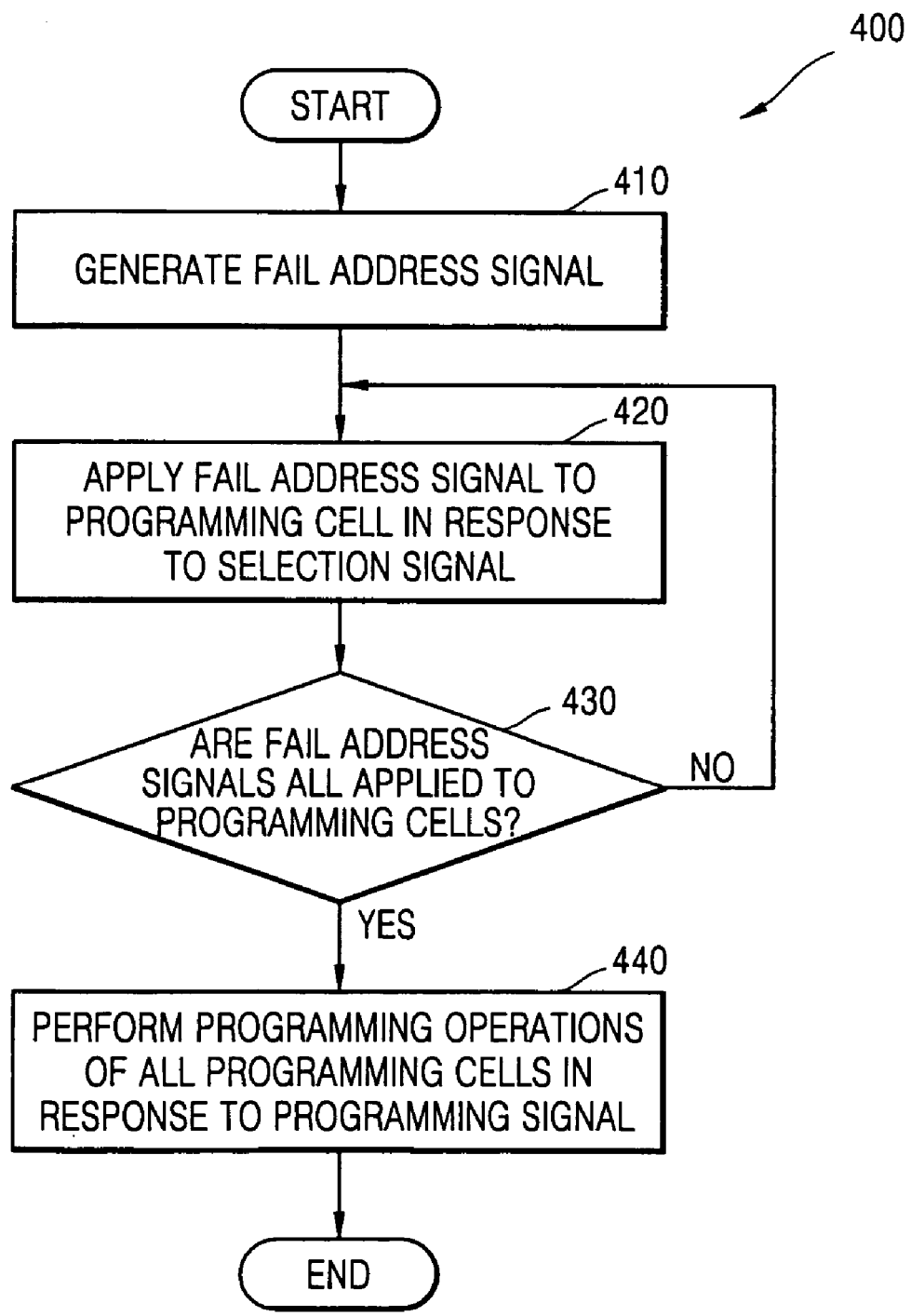
FIG. 4 is a flow chart illustrating a fail address programming method according to the present invention.

FIG. 4 is a flow chart illustrating a fail address programming method according to the present invention.

Referring to FIG. 4, at least a fail address signal having information about the position of the fail cell is generated by testing the semiconductor memory device (410). In addition, the fail address signal is applied to corresponding programming cell in response to a selection signal (420). Here, descriptions for the fail address signal and the selection signal are omitted since these are described above.

It is determined that whether the all generated fail address signals are applied to the programming cell (430). If the all fail address signals are not applied to the programming cell (420/430) are repeated.

When the all fail address signals are applied to the programming cell, the fail address signals in the all programming cells are programmed at once in response to the programming signal (440).

Figure 2:
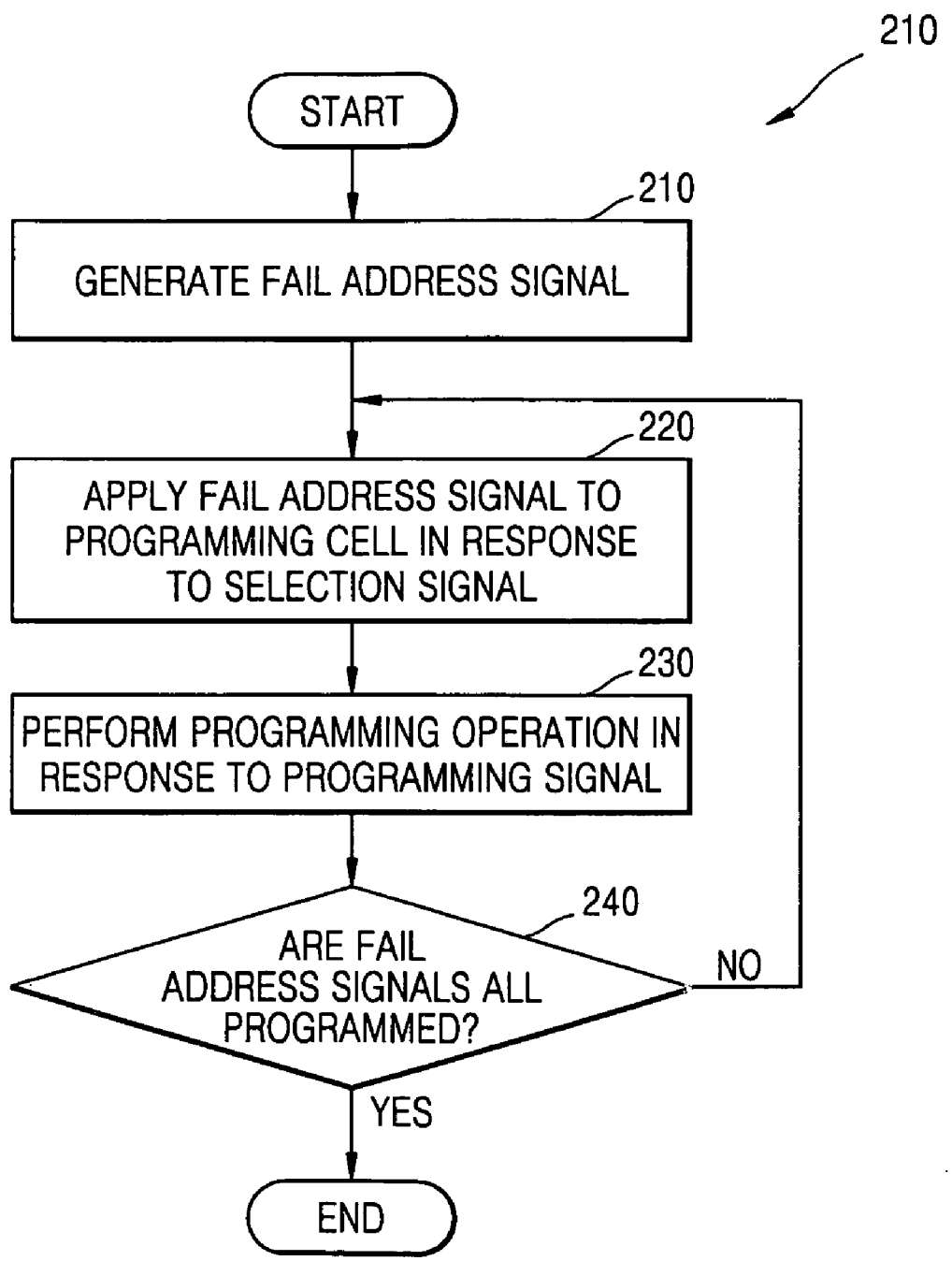
FIG. 2 is a flow chart illustrating a conventional fail address programming method.

Unlike the conventional fail address programming method shown in FIG. 2, in some embodiments according to the present invention as illustrated for example by FIG. 4, all the fail address signals can be applied to the corresponding programming cells, and programmed substantially simultaneously once, which may allow a reduction in the programming time of the fail address signals.

Figure 5:
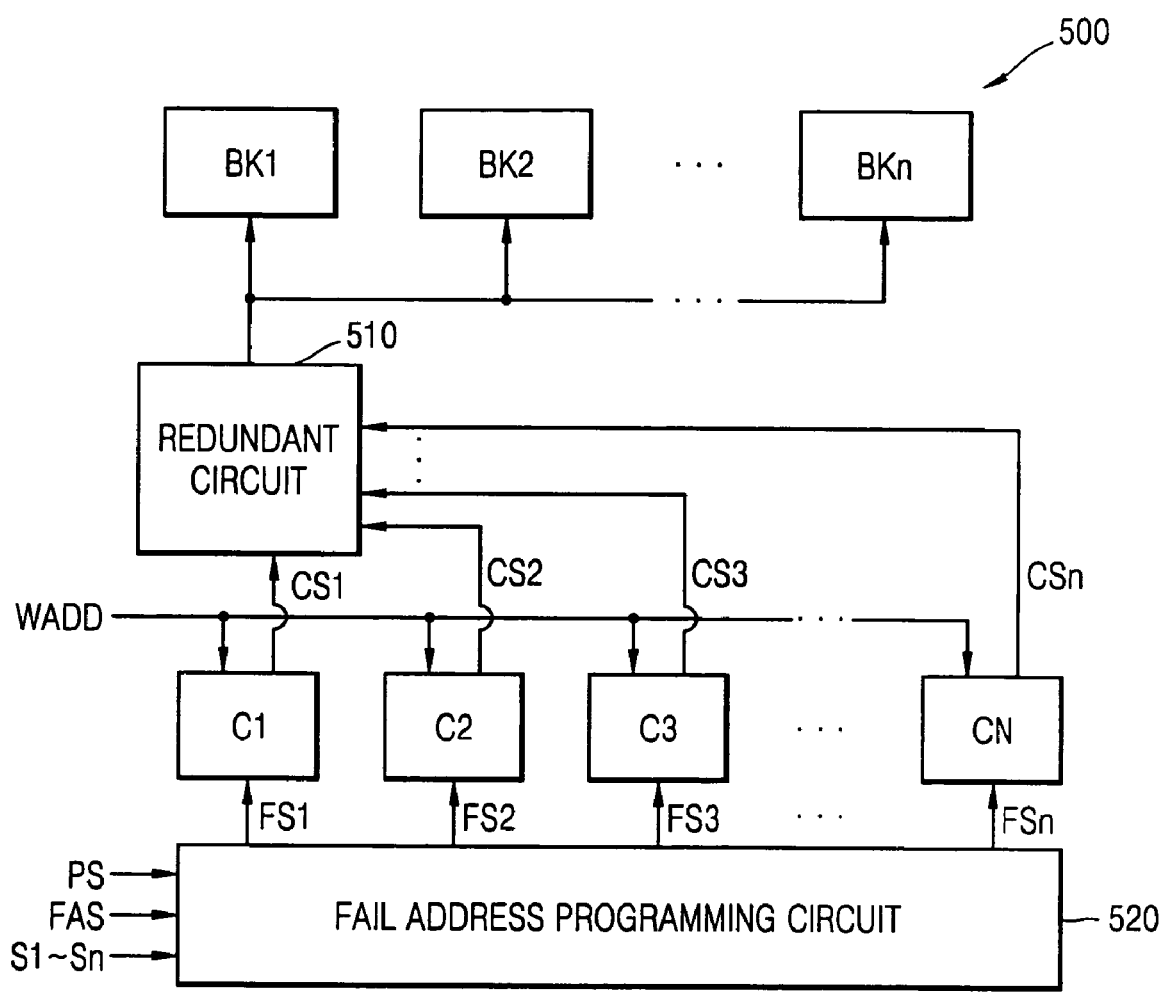
FIG. 5 is a block diagram showing a semiconductor memory device according to the present invention.

FIG. 5 is a block diagram showing a semiconductor memory device according to some embodiments of the present invention. The semiconductor memory device 500 shown in FIG. 5 is a semiconductor memory device including the fail address programming circuit 200 shown in FIG. 2. The semiconductor memory device 500 includes a plurality of memory banks BK1~BKn, a redundant circuit 510, a fail address programming circuit 520, and first~nth comparing units C1~Cn.

The redundant circuit 510 replaces the fail cell with a normal cell in response to first~nth control signals CS1~CSn. The fail address programming circuit 520 programs the FAS having the information about the position of the fail cell in response to the first~nth selection signals S1~Sn and the programming signal PS, and generates first~nth fuse signals FS~FSn corresponding to the FAS.

The first~nth comparing units C1~Cn compare the first~nth fuse signals FS1~FSn to an input write address signal (WADD), and generate the first~nth control signals CS1~CSn controlling the redundant circuit 510 if the first~nth fuse signals FS1~FSn are the same as the write address signals WADD.

A plurality of memory banks BK1~BKn include memory cells therein, and memory cells having defects are found among those memory cells by a test. When the fail cells are found, the FAS having the information about the positions of the fail cells are generated. The process of generating the FAS will be apparent to those skilled in the art, thus a detailed description of the process is omitted.

The generated FAS is applied to the fail address programming circuit 520. The process of programming the FAS in the fail address programming circuit 520 is described above, thus further detailed descriptions are omitted.

The fail address programming circuit 520 generates first~nth fuse signals FS1~FSn corresponding to the programmed FAS. Each of the fuse signals FS1~FSn has m bits like the fail address signal FAS. The first~nth fuse signals FS1~FSn have the information about the positions of the fail cells.

In order to write the data into the memory banks BK1~BKn, the write address signal WADD is input. The input write address signal WADD is compared to the corresponding fuse signals FS1~FSn in the first~nth comparing units C1~Cn. If the input WADD is same as one of first~nth fuse signals FS1~FSn, the corresponding control signal is activated and the other control signals are deactivated.

That the input WADD is the same as one of the first~nth fuse signals FS1~FSn means that the memory cell corresponding to the address, into which the data will be written, is a fail cell, thus the redundant circuit 510 should perform a process for replacing the fail cell with a normal cell.

The redundant circuit 510 performs the operation of replacing the fail cell with the normal cell in response to the activated control signal. The operation of the redundant circuit 510 can be easily understood by those who skilled in the art, thus detailed descriptions for the operation are omitted.

According to the semiconductor memory device 500 having the structure shown in FIG. 5, the time for programming the fail address signals FAS can be reduced, and thus the operational speed of the fail elimination process, in which the fail cell is replaced with the normal cell, can become faster.

As described above, the fail address programming circuit and the semiconductor memory device according to some embodiments of the present invention may have the advantage of reducing the time need to program the fail address signal in the programming cells. Accordingly, the operational speed of the elimination process may also becomes faster.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed:

1. A method of programming addresses of failed memory locations in a memory device, comprising:
    generating a plurality of fail address signals corresponding to a plurality of addresses of failed memory locations in the memory device; and then
    programming the plurality of addresses of failed memory locations to programming cells for use by a redundant circuit during read or write operations to the plurality of addresses of failed memory locations, wherein programming the plurality of addresses of failed memory locations comprises programming the plurality of addresses of failed memory locations to programming cells substantially simultaneously; wherein programming the plurality of addresses of failed memory locations further comprises:
        latching the plurality of fail address signals sequentially during a test of the memory device to provide a plurality of latched addresses of failed memory locations; and
        internally transferring the plurality of latched addresses of failed memory locations to inputs of the programming cells.

2. A method according to claim 1 wherein generating a plurality of fail address signals comprises generating all fail address signals for the memory device during a test of the memory device before programming the plurality of addresses of failed memory locations to the programming cells.

3. A method according to claim 1 wherein generating a plurality of fail address signals comprises generating the plurality of fail address signals in a test sequence for the memory device; and
    wherein programming the plurality of addresses of failed memory locations to programming cells comprises programming the plurality of addresses of failed memory locations to the programming cells in parallel.

4. A fail address programming method for a memory device, comprising:
    generating at least one fail address signal associated with a position of a fail cell;
    applying the fail address signal to a corresponding programming cell in response to a selection signal;
    determining whether all fail address signals for the memory device have been applied to the programming cells; and
    programming the fail address signals to all programming cells substantially simultaneously in response to a programming signal, if all fail address signals are applied to the programming cells, wherein programming the fail address signals further comprises:
        latching the fail address signals sequentially during a test of the memory device to provide a plurality of latched addresses of failed memory locations; and
        internally transferring the plurality of latched addresses of failed memory locations to inputs of the programming cells.

5. A method according to claim 4 wherein the programming cell includes fuses that are connected or blocked in response to the fail address signals.

6. A method according to claim 5 wherein the fuses are anti-fuses or electrical fuses.

7. A fail address programming circuit in a memory device comprising:
    a plurality of latches configured to store a plurality of fail address signals corresponding to a plurality of addresses of failed memory locations in the memory device and to provide the plurality of addresses of failed memory locations for programming after the plurality of fail address signals have been latched; and
    a plurality of programming cells, internally coupled to inputs of the plurality of latches, wherein the plurality of programming cells are configured to receive the plurality of addresses of failed memory locations via an internal transfer from the plurality of latches for programming with plurality of addresses of failed memory locations substantially simultaneously.

8. A circuit according to claim 7 wherein the plurality of fail address signals are determined sequentially during a test of the memory device to determine the failed memory locations in the memory device to provide a plurality of latched addresses of failed memory locations.

9. A fail address programming circuit of a semiconductor memory device, the circuit comprising:
    a first through an nth latch units storing fail address signals of m bits having information about fail cells in the semiconductor memory device in response to first through nth selection signals; and
    a first through an nth programming cells, internally electrically coupled to outputs of the first through an nth latch units, receiving the fail address signals transferred directly from the first through nth latch units and performing programming operations corresponding to the fail address signals in response to programming signals, wherein the first through nth programming cells perform the programming operations simultaneously in response to the programming signals.

10. The circuit of claim 9, wherein each of the first through nth latch units includes:
- m number of switches transmitting or blocking the corresponding fail address signals of m bits in response to the corresponding selection signal; and
- m number of latches receiving and storing the fail address signal from the m number of switches.

11. The circuit of claim 10, wherein the switches are transistors that are turned on or turned off in response to the selection signals.

12. The circuit of claim 9, wherein the first through nth selection signals are controlled by a mode register set signal, and activated sequentially.

13. The circuit of claim 9, wherein the first through nth programming cells include fuses that are connected or blocked in response to the fail address signals of m bits, respectively.

14. The circuit of claim 13, wherein the fuses are anti-fuses or electrical fuses.

15. The circuit of claim 9, wherein the programming signal is a current or a voltage that is input from the outside through at least an input/output pin or a pad.

16. A fail address programming method for a semiconductor memory device, the method comprising the operations of:
- generating at least one fail address signal having information about a position of a fail cell by testing the semiconductor memory device;
- applying the fail address signal to a corresponding programming cell in response to a selection signal;
- determining whether all fail address signals are applied to the programming cells; and
- programming the fail address signals in all the programming cells simultaneously in response to a programming signal, if all the generated fail address signals are applied to the programming cells, wherein programming the fail address signals further comprises:
  - latching the fail address signals sequentially during a test of the memory device to provide a plurality of latched addresses of failed memory locations; and
  - internally transferring the plurality of latched addresses of failed memory locations to inputs of the programming cells.

17. The method of claim 16, wherein the programming cell includes fuses that are connected or blocked in response to the fail address signals.

* * * * *